United States Patent [19]

Ninomiya

[11] 4,122,439
[45] Oct. 24, 1978

[54] SERIAL PARALLEL TYPE ANALOG TO DIGITAL CONVERTING DEVICE

[75] Inventor: Yuichi Ninomiya, Kawasaki, Japan

[73] Assignee: Nippon Hoso Kyokai, Japan

[21] Appl. No.: 649,731

[22] Filed: Jan. 16, 1976

[30] Foreign Application Priority Data

Jan. 23, 1975 [JP] Japan .................... 50-9238

[51] Int. Cl.² ......................................... H03K 13/175
[52] U.S. Cl. ...................... 340/347 AD; 340/347 CC; 340/347 M
[58] Field of Search .... 340/347 AD, 347 M, 347 CC; 324/99 D

[56] References Cited

U.S. PATENT DOCUMENTS

| 3,311,910 | 3/1967 | Doyle | 340/347 AD |
| 3,541,315 | 11/1970 | Naydan et al. | 340/347 AD |
| 3,581,304 | 5/1971 | Paradise et al. | 340/347 AD |
| 3,646,586 | 2/1972 | Kurz | 340/347 AD |
| 3,860,952 | 1/1975 | Tallent et al. | 360/36 X |
| 3,949,170 | 4/1976 | Shionoya | 340/347 AD X |
| 3,967,269 | 6/1976 | Fletcher | 340/347 AD |

OTHER PUBLICATIONS

Fletcher, A Video Analogue to Digital Converter, Oct. 1974, Report of the International Broadcasting Convention, pp. 47-57.

The Engineering Staff of Analog Devices, Inc., Analog–Digital Conversion Handbook, 6/1972, p. II--41.

Primary Examiner—Thomas J. Sloyan
Attorney, Agent, or Firm—Stevens, Davis, Miller & Mosher

[57] ABSTRACT

A serial parallel type A-D converting device having high accuracy and a simplified multi-stage configuration for correcting errors caused by d.c. drift or gain drift in a preceding stage, so as to obviate overloading in a succeeding stage, by means of offering previously a unidirectional level offset to a digital signal converted in the preceding stage, and correspondingly in the succeeding stage, expanding unidirectionally the dynamic range of an A-D converter, and shifting the level of a digital signal converted from an input analog signal deviating out of a normal range by an amount corresponding to the lowest bit of the digital signal converted in the preceding stage, wherein the level offset offered previously is removed later by adding a carry or by subtracting a borrow formed by the A-D converter in the succeeding stage.

10 Claims, 8 Drawing Figures

FIG. 3 _PRIOR ART_

Table I

| Input Signal Level | 4 Bits Output | Carry Borrow |
|---|---|---|
| Higher | 0001 | +1 |
|  | 0000 |  |
| Normal Range | 1111 | 0 |
|  | 1110 |  |
|  | 1101 |  |
|  | ⋮ |  |
|  | 0010 |  |
|  | 0001 |  |
|  | 0000 |  |
| Lower | 1111 | −1 |
|  | 1110 |  |

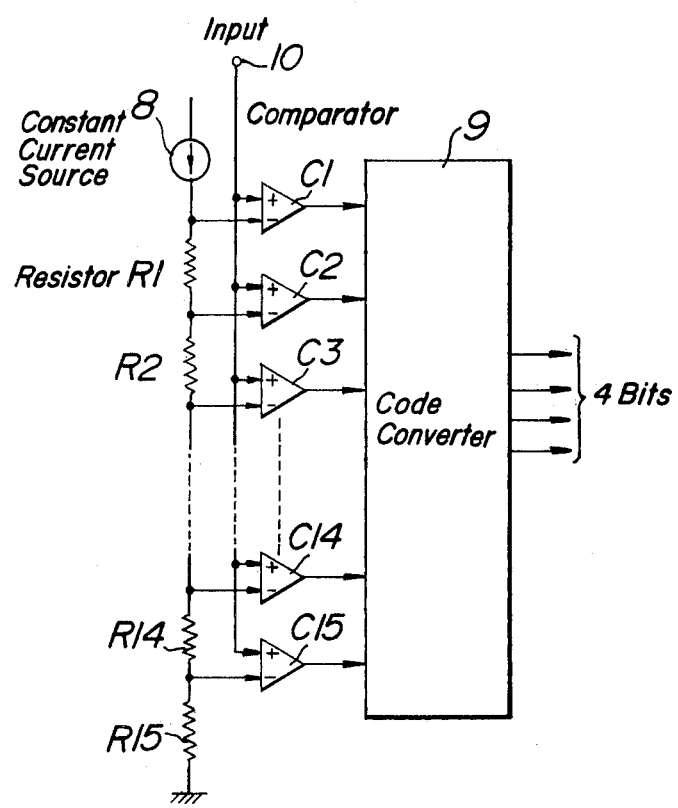
FIG._4

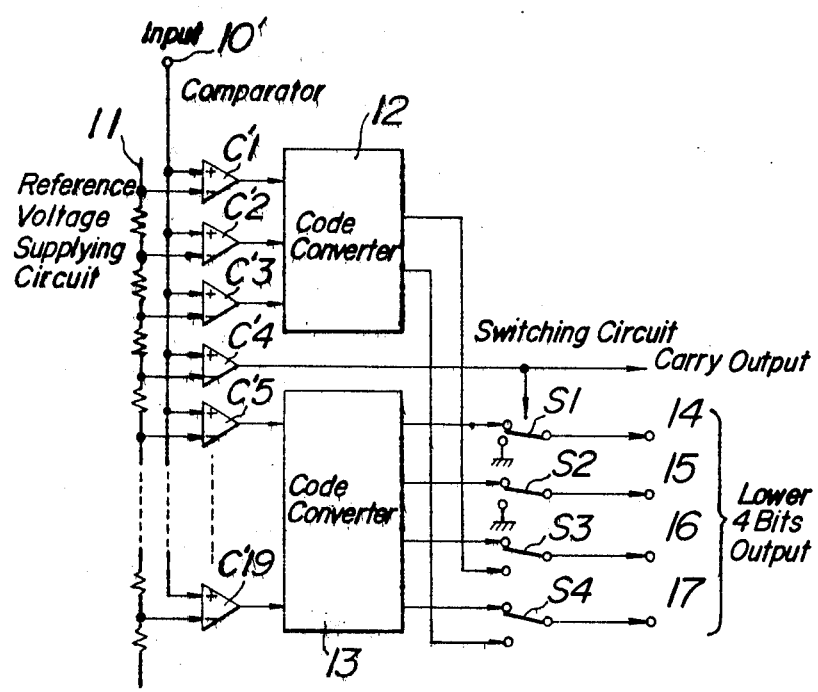

FIG. 6

Table 2

| Input Signal Level | 4 Bits Output | Carry |
|---|---|---|
| Higher ↑ | 0011<br>0010 | |
| | 0001<br>0000 | +1 |
| | 1111<br>1110<br>1101 | |
| Normal Range | ⎫<br>⎬<br>⎭ | 0 |
| ↓ | 0010 | |
| Lower | 0001<br>0000 | |

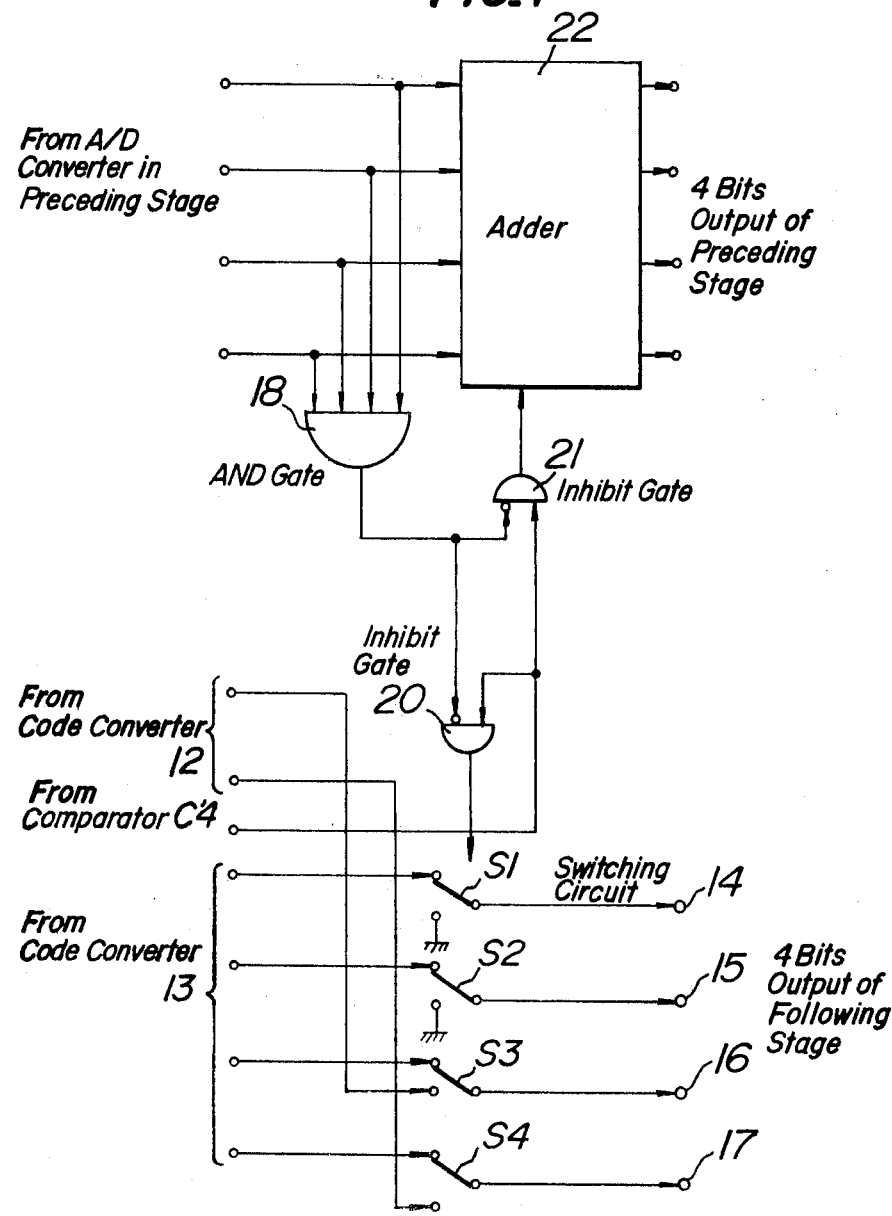

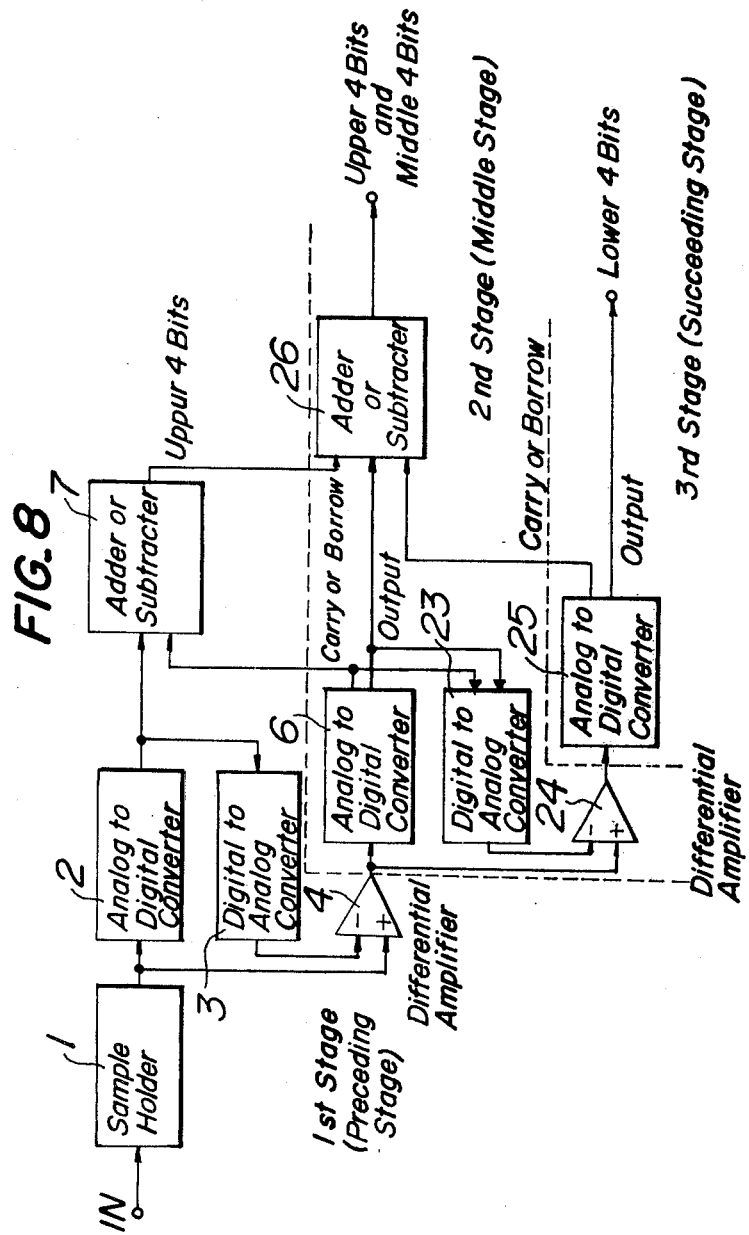

SERIAL PARALLEL TYPE ANALOG TO DIGITAL CONVERTING DEVICE

BACKGROUND OF THE INVENTION (1) Field of the Invention

The present invention relates to a serial parallel type analog to digital converting device having improved accuracy and a simplified multi-stage configuration.

(2) Description of the Prior Art

A conventional analog to digital converting device of the serial parallel type, wherein an output digital signal is formed separately into several groups of bits, consists of several analog to digital converting means, namely, several simple A-D converters, for forming the respective groups of bits, several digital to analog converting means, namely, several simple D-A converters, for converting the several groups of bits to respective equivalent analog signals, several differential amplifiers for obtaining successive differential analog signals between an input analog signal and the respective equivalent analog signals, and another A-D converter for forming a group of the lowest bits, so that, several converting stages are arranged successively in serial parallel.

The serial parallel type analog to digital converting device mentioned above has such a defect that, if an error of signal levels caused by d.c. drift or gain drift of the circuit components comprising any one of the preceding converting stages causes overloading in the following converting stages, high stability and high exactness, namely, high accuracy can not be realized.

To assist in understanding the invention, a serial parallel type analog to digital converting device consisting of two converting stages which form respectively upper 4 bits and lower 4 bits comprising an output digital signal of 8 bits will be explained for example as follows.

In the serial parallel type analog to digital converting device, a preceding converting stage consists of at least an analog to digital (A-D) converter wherein an input analog signal is compared with reference signals, and wherefrom a digital signal is derived as a result of the comparison, a digital to analog (D-A) converter wherein the digital signal is converted to an equivalent analog signal, and a differential amplifier wherefrom a differential output analog signal between the input analog signal and the equivalent analog signal is derived, and a succeeding converting stage consists at least of another A-D converter wherein the differential output analog signal is compared with other reference signals and wherefrom another digital signal is derived as a result of the comparison.

Accordingly, even if circuit components comprising the preceding converting stage have the smallest amount of d.c. drift or gain drift, the drift may cause a large amount of error of the signal levels in the following stage.

In an example of a serial parallel type analog to digital converting device of 8 bits shown in FIG. 1, an input analog signal sample-held by a sample-holder 1 is converted to a digital signal of upper 4 bit by a 4 bits A-D converter 2 in the preceding stage. The 4 bit output digital signal is converted to an equivalent analog signal by a D-A converter 3 in the preceding stage, and then a differential analog signal formed by subtracting the equivalent analog signal from the input analog signal is derived from a differential amplifier 4 in the preceding stage. The differential output analog signal is converted to a digital signal of lower 4 bits by a 4 bit A-D converter 5 in the following stage.

In the converting device shown in FIG. 1, if the differential amplifier 4 has a d.c. drift, an input signal applied to the plus terminal of the differential amplifier 4 from the sample-holder 1, which has applied thereto an input analog signal that is slightly higher than, for instance, the 1/2 level of the normal dynamic range, becomes equivalently lower than the 1/2 level owing to the negative drift of the differential amplifier 4 although the input analog signal is converted to an upper 4 bit digital signal which is higher than the 1/2 level by the upper A-D converter 2. Thus, the level of the differential output analog signal applied to the lower 4 bit A-D converter 5 deviates at the lower side from that of the normal dynamic range of the A-D converter 5, and consequently the A-D converter 5 overloads in the lower direction.

On the contrary, the input analog signal applied to the plus terminal of the differential amplifier 4 from the sample-holder 1, which has applied thereto an input analog signal that is slightly lower than the 1/2 level, becomes equivalently higher than the 1/2 level owing to the positive drift of the differential amplifier 4 although the input analog signal is converted to an upper 4 bit digital signal which is lower than the 1/2 level by the upper A-D converter 2. Thus, the level of the differential output analog signal applied to the lower 4 bit A-D converter 5 deviates at the higher side from that of the normal dynamic range of the A-D converter 5, and consequently the A-D converter 5 overloads in the higher direction.

If the differential amplifier 4 does not have d.c. drift but has a slight amount of gain drift occurring at a signal level which is apart from the d.c. zero level, the result is the same as mentioned above. Further, if the upper A-D converter 2 has inferior accuracy, the result is the same.

As mentioned above, in the serial parallel type analog to digital converting device, if the circuit components comprising the preceding converting stage do not have sufficiently high accuracy, the lower A-D converter 5 in the following converting stage overloads in the upper or lower direction, and consequently an error based on an irregular junction of the output digital signal occurs. Therefore, it is difficult to form a serial parallel type analog to digital converting device having superior accuracy.

One example of a serial parallel type analog to digital converting device wherein the error mentioned above is corrected, is shown in a report of the International Broadcasting Convention held in October, 1974, titled "A Video Analogue to Digital Converter" (pp. 47-57). In the converting device mentioned above, as shown in FIG. 3 on page 51 of the report, the dynamic range of an A-D converter in a following stage is expanded, so as to obviate overloading caused by an input analog signal deviating from the normal dynamic range of the A-D converter owing to an error in a preceding stage. In addition, the range of the output digital signal of the A-D converter, which deviates from the normal dynamic range in response to the input analog signal, is shifted by a uniform level corresponding to the lowest bit of an output digital signal of an A-D converter in the preceding stage, so as to form the same output digital signal as the one corresponding to an input analog signal resting in the normal dyanmic range. Further, a carry signal or a borrow signal is formed in response to the input analog signal deviating from the normal dynamic range in the following stage, and then the carry signal or the borrow signal is respectively added to, or subtracted from the output digital signal of the A-D converter in the preceding stage, so as to correct the error occurring in the preceding stage.

FIG. 2 shows the configuration of the serial parallel type analog to digital converting device having high accuracy improved in the manner mentioned above. A sample-holder 1, a 4 bit A-D converter 2, a 4 bit D-A converter 3 and a differential amplifier 4 in the preceding stage shown in FIG. 2 are the same as those shown in FIG. 1 respectively. On the other hand, a 4 bit A-D converter 6 in the following stage has a dynamic range which is expanded so that it is slightly wider on both sides than a normal one as shown by Table 1 in FIG. 3. Thus, the A-D converter 6 not only converts an input analog signal resting in the normal dynamic range to a 4 bit digital signal, but it can also convert an input analog signal deviating slightly from the normal dynamic range to an equivalent 4 bit digital signal which is the same as an output digital signal corresponding to an input analog signal having a level shifted by just the an amount of the lowest one of the upper 4 bits formed in the preceding stage. The reason is as follows.

For instance, if the level of the input analog signal deviates on the higher side of the normal dynamic range, and then rests in a range which is higher by one step of the upper 4 bits formed in the preceding stage, the upper 4 bits formed in the preceding stage should be corrected by adding one step, which is shown by the lowest one of the upper 4 bit digital signal, and accordingly the lower 4 bits should be shifted by the one step, that is, by the lowest one of the upper 4 bits, so as to correct it in response to the corrected upper 4 bit digital signal.

Furthermore, the A-D converter 6 applies a carry analog signal of "+1" in response to an input signal having a level higher than that of the normal dynamic range, a carry signal of "0" in response to an input analog signal having a level resting in the normal dynamic range, and a borrow signal of "−1" in response to an input analog signal having a level lower than that of the normal dynamic range, to an adder-subtracter 7 respectively, so as to carry or to borrow the 4 bit output digital signal of the A-D converter in the preceding stage.

According to such treatment of the signals as mentioned above, even if the circuit components except the D-A converter 3 and the adder-subtracter 7 in the preceding converting stage have inferior accuracy, the lower 4 bit A-D converter 6 in the following stage never overloads in either direction of the normal dynamic range, and accordingly the irregular junction does not at all occur in the output digital signal. Thus, it is possible to improve the accuracy of the serial parallel type analog to digital converting device.

Nevertheless, in the serial parallel type analog to digital converting device mentioned above, it is required for the A-D converter 6 to form both the carry signal "+1" and the borrow signal "−1" to be applied to the adder-subtracter 7 in response to the level of the input analog signal. Accordingly, it is required that the A-D converter 6 have a complicated circuit configuration, structure, and furthermore it is required that the adder-subtracter 7 use an arithmetical unit capable of both additive and subtractive operations. Therefore, the serial parallel type analog to digital converting device mentioned above has a defect in that its configuration is complicated.

SUMMARY OF THE INVENTION

An object of the present invention is to realize a serial parallel type analog to digital converting device having high accuracy and a simplified multi-stage configuration.

The serial parallel type analog to digital converting device according to the present invention has such a distinctive feature that, in the case of correcting an error caused by circuit components in a preceding one of the converting stages comprising the serial parallel type analog to digital converting device by expanding the dynamic range of the succeeding converting stage, overloading caused by the input analog signal deviating from the normal dynamic range owing to the error in the preceding stage is obviated. The device shifts the level of the output digital signal of the succeeding stage in response to the level of the input analog signal deviating from the normal dynamic range by a uniform level corresponding to the lowest bit of an output digital signal of the preceding stage, so as to form the same output digital signal as the one corresponding to the input analog signal resting in the normal dynamic range. Further, the device forms a carry or borrow signal in response to the level of the input analog signal deviating from the normal dynamic range in the succeeding stage, and also treats arithmetically the output digital signal of the preceding stage with the carry or borrow signal so as to correct the error caused in the preceding stage. Suitable circuit components comprising the preceding converting stage are provided previously with a positive or negative level offset, which restores a whole level offset in the preceding converting stage always into either one of the positive or negative sides of the normal range, regardless of the polarity of the error caused by instability of the preceding stage. Thus, the input analog signal deviating from the normal dynamic range rests in a previously provided range shifting only in one direction from the normal dynamic range.

The normal dynamic range of the analog to digital converter mentioned above is as follows.

An A-D converter in a succeeding converting stage of the serial parallel type analog to digital converting device having multi-stages is responsible for A-D conversion within a range corresponding to one step of a digital signal converted in a preceding converting stage. For instance as to a decimal code, 10 corresponding to one step of a code of 100 so that, one step of the digital code signal formed in the preceding stage is a normal dynamic range of the A-D converter in the succeeding stage.

BRIEF DESCRIPTION OF THE DRAWINGS

FIG. 3 is a table showing the relation between output digital signals derived from an A-D converter in a succeeding converting stage shown in FIG. 2 and carry and borrow signals corresponding to those output digital signals;

FIG. 4 is a block diagram showing an embodiment of an A-D converter in a preceding converting stage of a serial parallel type analog to digital converting device according to the present invention;

FIG. 5 is a block diagram showing an embodiment of an A-D converter in a succeeding converting stage of the serial parallel type analog to digital converting device according to the present invention;

FIG. 6 is a table showing relation between output digital signals derived from the A-D converter shown in FIG. 5 and carry signals corresponding to those output digital signals;

FIG. 7 is a block diagram showing a part of another embodiment of the serial parallel type analog to digital converting device according to the present invention; and FIG. 8 is a block diagram showing still another embodiment of the serial parallel type analog to digital converting device according to the present invention, consisting of three converting stages.

DESCRIPTION OF THE PREFERRED EMBODIMENTS

Figure 1:
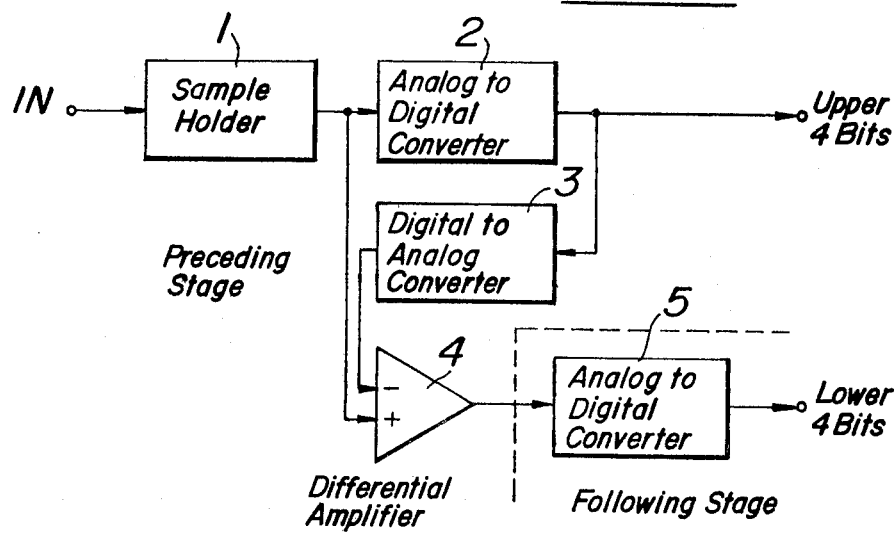
FIG. 1 is a block diagram showing an ordinary serial parallel type analog to digital converting device.
Figure 2:
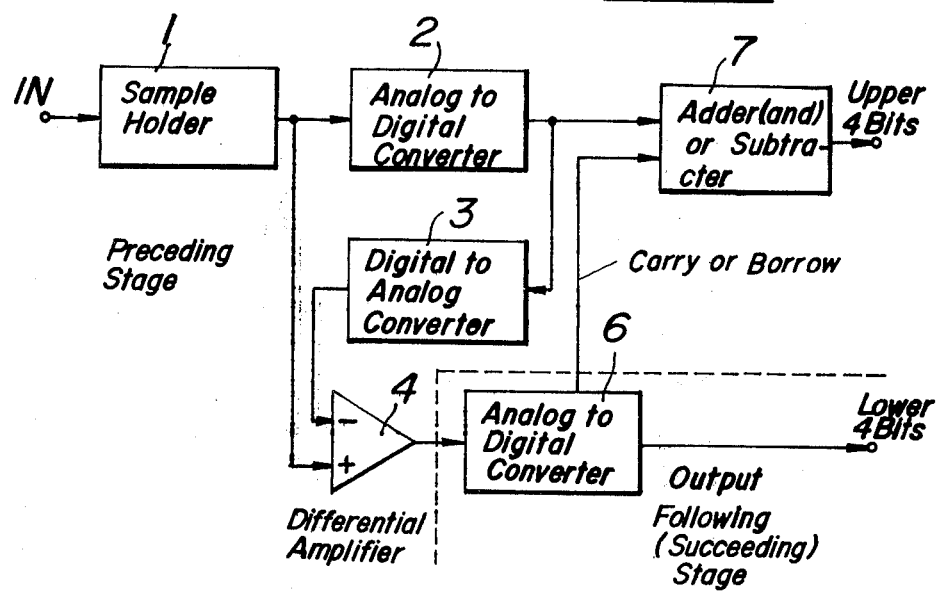
FIG. 2 is a block diagram showing a serial parallel type analog to digital converting device having high accuracy improved in a conventional manner.

According to the present invention, a serial parallel type analog to digital converting device, for instance, as shown in FIG. 2, is simplified in configuration as follows.

FIG. 4 shows a 4 bit A-D converter (corresponding to block 2 in FIG. 2) in a preceding converting stage of an 8 bit analog to digital converting device of serial parallel type according to the present invention, which is provided with such level offset as mentioned earlier. The A-D converter shown in FIG. 4 is arranged so as to form a digital signal having a negatively offset level used for correcting the error by shifting the levels of reference signals. The reference signals to be applied respectively to comparators C1-C15 arranged in parallel are derived, for instance, from resistors R1-R15 which are connected in series to each other and fed by a constant current source 8. According to the present invention, the resistances of all of the resistors R1-R14 have the same value of R, and the resistance of the resistor R15, that is, of the end one of the resistors connected in series, has a value of $R(1+\alpha)$, which is slightly larger than R. A code converter 9 shown in FIG. 4 converts a hexadecimal code signal of one figure to a binary code signal of four figures, and the input signal to be converted is supplied to a terminal 10.

The A-D converter arranged as mentioned above forms a negatively offset level of $\alpha/16$ used for the error correction. That is, one step of an upper 4 bit binary code signal formed by the A-D converter mentioned above is 1/16 of the normal dynamic range of the A-D converter. Accordingly, the resistance of $R(1+\alpha)$ of the resistor R15 offers a negative level offset of $\alpha/16$ to all of the reference signals derived respectively from the resistors R1-R15. Furthermore, if it is required to offer a positive level offset to the reference signals, it is enough to make the resistance of resistor R15 equal to $R(1-\alpha)$.

Otherwise, it is possible to shift the d.c. level in the differential amplifier 4 shown in FIG. 2, so as to form either a positively or negatively offset level used for error correction. The d.c. level shifting in the differential amplifier 4 is performed, for instance, by shifting a bias voltage applied to either one of pair of amplifiers comprising the differential amplifier 4.

FIG. 5 shows a 4 bit A-D converter (corresponding to the block 6 in FIG. 2) in a succeeding converting stage of the 8 bit analog to digital converting device of the serial parallel type according to the present invention. In the A-D converter shown in FIG. 5, when a whole level offset rests always, for instance, in the positive range, it is possible to convert the input analog signal having a level which deviates in the higher direction from the normal dynamic range to a normal digital signal, and overloading never occurs. Table 2 in FIG. 6 shows the relation between levels of output digital signals of the A-D converter mentioned above and carries corresponding respectively to those levels. With reference to Table 2 shown in FIG. 6, it is evident that carry signals only of "0" and "+1" are formed by the A-D converter shown in FIG. 5.

The 4 bit A-D converter mentioned above consists of comparators C'1-C'19 arranged in parallel and coupled to a reference voltage supplying circuit 11, a code converter 12 for converting a tetral code signal of one figure to a binary code signal of two figures, a code converter 13 for converting a hexadecimal code signal of one figure to a binary code signal of four figures, and switching circuits S1-S4. As for the code converters 12 and 13, it is possible to use conventional ones.

In the code converter 12, an output digital signal having 2 bits of 11, 10, 01 or 00 is formed in response to the level of the input analog signal deviating in the higher direction from the normal dynamic range of the A-D converter shown in FIG. 5. On the other hand, in the code converter 13, a 4 bit output digital analog signal is formed in response to the input signal resting in the normal dynamic range of the A-D converter.

Furthermore, an output signal derived from the comparator C'4 is used for a carry signal. For example, if the level of the input analog signal applied to the A-D converter shown in FIG. 5 deviates from the normal dynamic range, the comparator C'4 forms an output signal of "+1", which controls the switching circuits S1-S4, as shown in FIG. 5, in such a manner that the switching circuits S1 and S2 supplies output terminals 14 and 15 with signals of "0", and the switching circuits S3 and S4 supplies output terminals 16 and 17 with output digital signals derived from the code converter 12. In this case, the A-D converter shown in FIG. 5 forms an output digital signal of 0011, 0010, 0001 or 0000 in response to the level of the input analog signal. On the other hand, if the level of the input analog signal rests in the normal dynamic range of the A-D converter, the output signal derived from the comparator C'4, that is, the carry signal is "0", so that the switching circuits S1-S4 are controlled, as shown in FIG. 5, to supply the output terminals 14-17 with output digital signals derived from the code converter 13.

Accordingly, in the former case, the output signal of "+1", that is, a carry signal derived from the comparator C'4 is applied to the adder 7 shown in FIG. 2, so as to correct the upper 4 bit digital signal by adding one step to it, and then controls the switching circuits S1-S4 so as to correct the lower 4 bit digital signal in response to the correction of the upper 4 bit digital signal. On the other hand, in the latter case, the output signal of "0" derived from the comparator C'4 controls the switching circuits S1-S4 so as to compose the lower 4 bit digital signal with output signals derived from a group of comparators corresponding to the normal dynamic range.

The switching circuits S1-S4 consists, for instance, of conventional electronic switches.

According to the present invention, if the whole level offset rests in a positive, that is, higher range as mentioned above, the adder is used for the correction of the upper bit digital signal. In contrast, if the whole level offset is negative, that is, is in the lower range by means of offering previously a positive level offset, it is required naturally to use a subtracter for the correction of the upper bit digital signal.

FIG. 7 shows a part of another embodiment of the 8 bit analog to digital converting device of the serial parallel type according to the present invention. The embodiment shown in FIG. 7 has been modified in such a way that, in case all 4 bits comprising the output digital signal derived from the A-D converter (corresponding to the block 2 in FIG. 2) in the preceding stage are "1", even if the 4 bit A-D converter (corresponding to block 6 in FIG. 2) in the succeeding stage overloads, the upper 4 bit digital signal formed in the preceding stage is not changed by a carry, and further the output digital signal formed in the succeeding stage is maintained in the 1111 state.

That is, in the case in which all bits of the output digital signal formed in the preceding stage are 1, an output signal of 1 is derived from an AND gate 18, so that, output signals of 0 are derived from both of the inhibit gates 20 and 21. Switching circuits S1-S4 contained in the A-D converter in the succeeding stage are controlled by the inhibit gate 20 in such a manner that all of the switching circuits S1-S4 are switched to their upper sides, as shown in FIG. 7, in response to the output signal of 0 applied from the inhibit gate 20, and, on the other hand, are switched to their lower sides in response to the output signal of 1.

Accordingly, if all of the upper 4 bits comprising the output digital signal are 1, even if the A-D converter in the succeeding stage overloads, all bits of the whole output digital signal of the serial parallel type analog to digital converting device are maintained in a state of 1, and besides a carry signal of "+1" is arrested by the inhibit gate 21, so that it is never applied to an adder 22 (corresponding to the block 7 in FIG. 2). Accordingly, it is enough for the adder 22 to use a conventional adder wherein an output signal of 0000 is obtained by means of adding a signal of 1 to another signal of 1111, and which consists of an AND gate and an exclusive logical sum circuit in a conventional manner. In connection with the above description, one inhibit gate can be used instead of the two gates 20 and 21.

That is to say, if the level of the input signal applied to the serial parallel type analog to digital converting device shown in FIG. 7 exceeds the entire normal dynamic range of the converting device, all bits of the whole output digital signal are always maintained at a level of 1 so that an irregular drop of the signal level never occurs.

As explained above, according to the present invention, it is possible to realize a serial parallel type analog to digital converting device having superior accuracy by using circuit components having only ordinary accuracy sufficient to treat signals in the respective converting stages, such as the differential amplifiers and the A-D converters, except the D-A converters from which it is easy to obtain comparatively high accuracy. Furthermore, if an analog shift register and other components are inserted between the respective converting stages of the serial parallel type converting device so as to improve the speed of operation, it is possible to use an analog shift register having ordinary accuracy which is only enough to provide operation of the respective one stage.

Besides, as for an arithmetical unit (corresponding to the block 7 in FIG. 2) used for improving accuracy of the serial parallel type analog to digital converting device, it is possible in accordance with the present invention to use only either one of an adder and a subtracter, although it is required in the conventional converting device as mentioned earlier to be provided with both of faculties of adding and of subtracting.

Consequently, it is possible in accordance with the present invention to simplify the whole configuration of the serial parallel type analog to digital converting device having superior accuracy.

The present invention can be applied not only to a serial parallel type analog to digital converting device of two stages as shown in FIG. 2, but naturally to one of more than two stages.

For instance, FIG. 8 shows an embodiment of a serial parallel type analog to digital converting device of three stages according to the present invention.

The 12 bit analog to digital converting device shown in FIG. 8 is arranged in such a way that a middle converting stage, which is formed almost the same as the preceding converting stage shown in FIG. 2, is inserted between the preceding and the succeeding converting stages.

In the middle converting stage shown in FIG. 8, a middle 4 bit A-D converter 6 applies either one of a carry signal and a borrow signal to the adder or the subtracter 7, so as to remove the previously offered level offset from the upper 4 bit digital signal formed in the preceding converting stage, which is applied to an adder or subtracter 26 in the middle converting stage through the adder or subtractor 7. Furthermore, either one of the carry signal and the borrow signal derived from the A-D converter 6 is applied also to a D-A converter 23, so as to remove the previously offered level offset from a differential output analog signal of a differential amplifier 24, which is applied to a lower 4 bit A-D converter 25 in the succeeding converting stage.

The adder or subtracter 26 in the middle converting stage is applied, as shown in FIG. 8, with both of the upper 4 bit digital signal formed in the preceding stage and the middle 4 bit digital signal formed in the middle stage, and further either one of the carry signal and the borrow signals formed by the A-D converter 25 in the succeeding stage. So that, an output digital signal derived from the adder or subtracter 26 consists of the upper 4 bit and middle 4 bit digital signals which are corrected by adding the carry signal or by subtracting the borrow signal.

A serial parallel type analog to digital converting device consisting of more than three stages can be realized by inserting a required number of middle converting stages which are just the same as mentioned above, excepting that respective adders or subtracters are applied respectively with the carry or borrow signal and the digital signal formed in respective middle converting stages themselves and with all of digital signals formed and corrected respectively in successively preceding converting stages.

What is claimed is:
1. A serial parallel type analog to digital converting device comprising:
 a preceding converting stage including;
  a first analog to digital converter for producing a first digital signal having a plurality of bits as a result of comparison between an input analog signal and a plurality of reference signals, a digital to analog converter for converting said first digital signal to a corresponding analog signal, a differential amplifier for producing a differential analog signal between said input analog signal and said corresponding analog signal, said preceding converting stage including means for producing a uniform level offset in said differential analog signal corresponding to the order of the lowest bit of said first digital signal, and an arithmetic circuit, and a succeeding converting stage including;

a second analog to digital converter having a normal dynamic range and an additional dynamic range expanded from said normal dynamic range in only one direction, said one direction corresponding to said uniform level offset produced in said differential analog signal by said preceding converting stage, for converting said differential analog signal to a second digital signal having a plurality of lower bits representing analog values residing in either one of said normal dynamic range and said additional dynamic range and for producing a correction signal used for correcting said first digital signal in said only one direction when the level of said differential analog signal provided with said uniform level offset is within said additional dynamic range of said second analog to digital converter, said arithmetic circuit arithmetically combining said first digital signal and said correction signal to produce a corrected first digital signal having a plurality of upper bits.

2. A serial parallel type analog to digital converting device as claimed in claim 1, wherein said first analog to digital converter comprises a plurality of resistors connected in series with each other and to a constant current source for forming a plurality of reference signals, a plurality of comparators for comparing said input analog signal with said plurality of reference signals respectively, and a code converter for converting the digital signals from said plurality of comparators to a binary code signal.

3. A serial parallel type analog to digital converting device as claimed in claim 2, wherein one of said plurality of resistors has a resistance which is different from the resistances of the others of said plurality of resistors, so as to provide a plurality of reference signals having said uniform level offset.

4. A serial parallel type analog to digital converting device as claimed in claim 1, wherein the d.c. level of operation in the differential amplifier is shifted so as to provide said uniform level offset to said differential analog signal.

5. A serial parallel type analog to digital converting device as claimed in claim 1, wherein said second analog to digital converter comprises a reference voltage signal supplying circuit having a plurality of resistors connected in series with each other for forming a plurality of reference signals, a plurality of comparators for comparing said differential analog signal with said plurality of reference signals to produce a plurality of digital signals, respectively, a first code converter for converting a first group of digital signals derived from a first group of said plurality of comparators to a first binary code signal, said first group of comparators being responsive to said differential analog signals residing in said additional dynamic range, a second code converter for converting a second group of digital signals derived from a second group of said plurality of comparators to a second binary code signal, said second group of comparators being responsive to said differential analog signal residing in said normal dynamic range, and a plurality of switching circuits receiving a control digital signal which is derived from the remaining one of said plurality of comparators and which corresponds to a threshold level separating said normal dynamic range from said additional dynamic range for switching, under control of said control digital signal, so that said second binary code signal is derived as said second digital signal when said control digital signal is not produced, and so that said first binary code signal is derived as said second digital signal when said control digital signal is produced, said control digital signal being derived as said correction signal.

6. A serial parallel type analog to digital converting device as claimed in claim 5, further including an AND gate circuit receiving all bit signals comprising said first digital signal, and at least one inhibit gate circuit having an inhibiting input terminal for receiving an output signal from said AND gate circuit and an input terminal for receiving said correction signal derived from said second analog to digital converter for applying an output signal from said inhibit gate circuit to said arithmetic circuit and to said plurality of switching circuits as a modified correction signal instead of said correction signal.

7. A serial parallel type analog to digital converting device as claimed in claim 1, further comprising a second digital to analog converter receiving said digital signal from said second analog to digital converter and said correction signal, a second differential amplifier receiving an output signal from said second digital to analog converter and said differential analog signal, a third analog to digital converter receiving an output analog signal from said second differential amplifier for producing an output digital signal having a plurality of lower bits and a second correction signal, and a second arithmetic circuit receiving said digital signal from said second analog to digital converter, said digital signal from said arithmetic circuit, and said second correction signal for producing a digital signal having a plurality of upper and middle bits.

8. A serial parallel type analog to digital converting device as claimed in claim 1, wherein said plurality of reference signals are shifted in only one direction to produce said uniform level offset so that said second digital signal resides within said normal dynamic range and said additional dynamic range.

9. A serial parallel type analog to digital converting device as claimed in claim 1, wherein said arithmetic unit is an adder and said correction signal is a carry signal, when said uniform level offset is produced in a direction in which a level of said differential analog signal is raised.

10. A serial parallel type analog to digital converting device as claimed in claim 1, wherein said arithmetic unit is a subtracter and said correction signal is a borrow signal, when said uniform level offset is produced in a direction in which a level of said differential analog signal is lowered.

* * * * *